United States Patent [19]

Katagiri et al.

[11] Patent Number: 4,886,858

[45] Date of Patent: Dec. 12, 1989

[54] THERMOSETTING RESIN AND PREPREG AND LAMINATE USING THE SAME

[75] Inventors: Junichi Katagiri, Ibaraki; Akira Nagai; Keiko Tawara, both of Hitachi; Akio Takahashi, Hitachiota; Motoyo Wajima, Hitachi; Toshikazu Narahara, Ibaraki; Ryo Hiraga, Hitachiota, all of Japan

[73] Assignee: Hitachi, Ltd., Toyota, Japan

[21] Appl. No.: 15,325

[22] Filed: Feb. 17, 1987

[30] Foreign Application Priority Data

Feb. 19, 1986 [JP] Japan ................................ 61-33050
Apr. 16, 1986 [JP] Japan ................................ 61-85966

[51] Int. Cl.$^4$ ................... C08F 12/08; C08F 12/12; C08F 265/02
[52] U.S. Cl. ................... 525/301; 156/306.9; 428/209; 526/346; 526/347; 525/241; 525/250; 525/263; 525/276; 525/281; 525/285; 525/288; 525/312; 525/328.8; 525/333.3
[58] Field of Search .............. 526/293, 301, 346, 347; 525/328.8, 333.3, 263

[56] References Cited

U.S. PATENT DOCUMENTS 2,915,511 12/1959 Blanchette ................... 525/333.3

FOREIGN PATENT DOCUMENTS 0138609 4/1985 European Pat. Off. .
0202488 11/1986 European Pat. Off. .
691036 5/1953 United Kingdom .

OTHER PUBLICATIONS

Journal of Polymer Science, Polymer chemistry edition, vol. 12, No. 10, 1974, p. 2453, John Wiley & Sons, Inc., New York, U.S.; P. Ferruti et al.: "1-methacryloylimidazole as methacrylating agent".

Primary Examiner—Jacob Ziegler
Attorney, Agent, or Firm—Antonelli, Terry & Wands

[57] ABSTRACT

A thermosetting resin composition comprising a special poly(p-hydroxystyrene) derivative resin and a radical polymerization initiator, and if necessary an epoxy modified polybutadiene, can provide prepregs and laminates having a low dielectric constant, a shorter signalling delay time, good heat resistance and flame retardancy and thus being suitable for producing multilayer printed circuit boards.

6 Claims, 1 Drawing Sheet

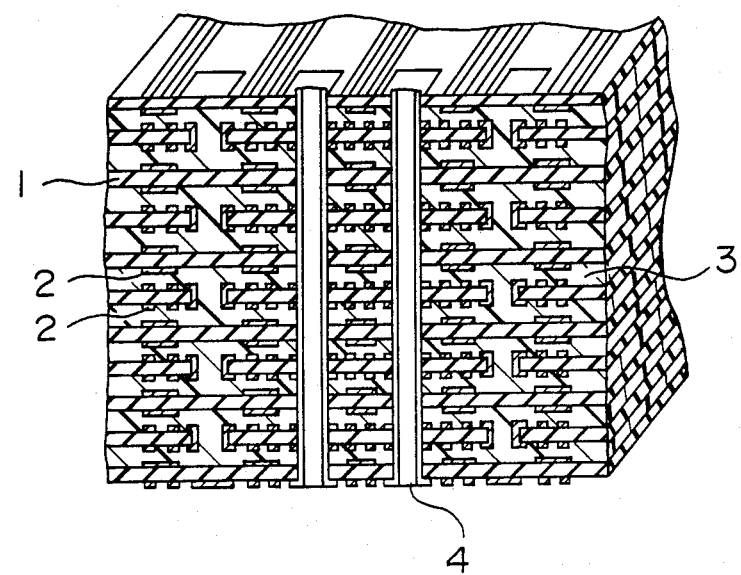

THERMOSETTING RESIN AND PREPREG AND LAMINATE USING THE SAME

BACKGROUND OF THE INVENTION

This invention relates to a thermosetting resin, a prepreg and a laminate obtained by using the same, and a multilayer printed circuit board excellent in heat resistance, electrical properties and fire retardance obtained by using such a prepreg and/or laminates.

Heretofore, as laminate materials for multilayer printed circuit boards, there have mainly been used phenol resins, epoxy resins and polyimide resins. Particularly in the case of a large-sized computer, higher density is desired and thus there are used polyimide series resins excellent in heat resistance and dimensional stability. But recently, with a fast operational treatment in large-sized computers, there are required printed circuit boards excellent in electrical properties in order to improve a signalling rate. Particularly, in order to shorten a signalling delay time and to lessen a circuit thickness, printed circuit boards with a low dielectric constant are required. As the low dielectric constant laminate materials, there are developed laminates made from tetrafluoroethylene resin (PTFE), polybutadiene resins, etc. Such laminates are disclosed, for example, in Proc. NEPCON (1981), pp. 160–169, and Japanese Patent Unexamined Publication No. 55-127426.

But PTFE laminates have many problems in that since the resin is thermoplastic and has a low glass transition temperature, the thermal expansion coefficient is large at high temperatures and the dimensional stability is insufficient. Particularly when a large number of PTFE layers are laminated and bonded, there is anxiety in through-hole reliability. Thus, when applied to multilayer printed circuit boards, the same wiring density as the epoxy resin is employed and a merit of being a low dielectric constant material is scarcely shown. Further, since there is no suitable solvent for the PTFE, a bonding method by heat melting contact bonding is generally employed. But there is a defect in that the melting temperature is very high.

On the other hand, polybutadiene resins have a defect of flammability from a viewpoint of molecular structure. In order to impart flame retardancy to polybutadiene resins, it is necessary to add an addition type flame retardant such as decabromodiphenyl ether, triphenyl phosphate, etc., a reaction type flame retardant such as tribromophenyl methacrylate, tribromophenyl acrylate, etc. But there is a problem in that the electrical properties, heat resistance and dimensional stability inherent to the polybutadiene resins are damaged by such an addition.

SUMMARY OF THE INVENTION

It is an object of this invention to provide a low dielectric constant laminate material capable of having the same high density wiring as polyimide laminate materials, having flame retardancy and a shorter signalling delay time, and usable in place of polyimide series multilayer printed wiring boards which have been used in large-sized computers. In order to attain such an object, this invention provides a resin, a resin composition, a prepreg, a laminate and a multilayer printed circuit board using such a resin material.

This invention provides a thermosetting poly(p-hydroxystyrene) derivative resin represented by the formula:

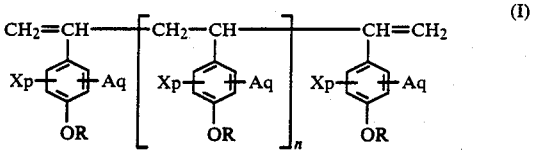

wherein A is an alkyl group; X is a halogen group; R is an alkenyl or alkenoyl group having 2 to 4 carbon atoms; p and q are independently zero or an integer of 1 to 4; and n is an integer of 1 to 100.

This invention also provides a thermosetting resin composition comprising a poly(p-hydroxystyrene) derivative resin represented by the formula:

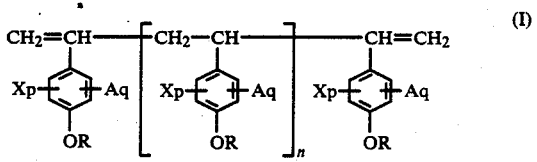

wherein A is an alkyl group; X is a halogen group; R is an alkylene or alkenoyl group having 2 to 4 carbon atoms; p and q are independently zero or an integer of 1 to 4; and n is an integer of 1 to 100, and an epoxy modified polybutadiene represented by the formula:

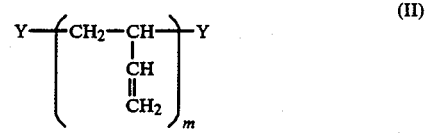

wherein Y is an epoxy resin; and m is an integer of 4 to 100.

This invention further provides a prepreg obtained by impregnating a sheet-like base material with a varnish containing a solvent and a thermosetting resin composition comprising a poly(p-hydroxystyrene) derivative resin represented by the formula (I), a radical polymerization initiator, and if necessary an epoxy modified polybutadiene represented by the formula (II), followed by removal of the solvent by drying.

This invention still further provides a laminate obtained by impregnating a base material with a varnish containing a solvent and a thermosetting resin composition comprising a poly(p-hydroxystyrene) derivative resin represented by the formula (I), a radical polymerization initiator, and if necessary an epoxy modified polybutadiene represented by the formula (II), removing the solvent by drying to give a prepreg, and piling a plurality of prepregs, followed by pressing with heating.

This invention further provides a multilayer printed circuit board comprising a plurality of insulating layers and a plurality of circuit conductor layers, said insulating layers and said circuit conductor layers being laminated and bonded alternately, said insulating layers being obtained by impregnating a sheet-like base material with a varnish containing a solvent and a thermosetting resin composition comprising a poly(p-hydroxystyrene) derivative resin represented by the formula (I), a radical polymerization initiator, and if necessary an epoxy modified polybutadiene represented by the formula (II), followed by removal of the solvent by drying.

BRIEF DESCRIPTION OF THE DRAWING

The attached drawing is a perspective cross-sectional view of one example of multilayer printed circuit bords according to this invention.

DESCRIPTION OF THE PREFERRED EMBODIMENTS

The poly(p-hydroxystyrene)derivative resin used as an essential component in the thermosetting resin composition of this invention is represented by the formula:

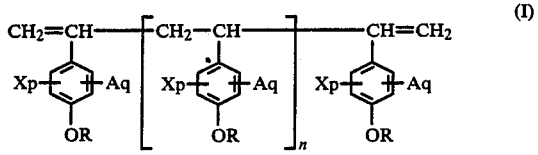

wherein A is an alkyl group preferably having 1 to 10 carbon atoms; X is a halogen group, e.g. fluorine, chlorine, bromine or iodine atom; R is an alkylene or alkenoyl group having 2 to 4 carbon atoms such as an allyl group, an isobutenyl group, a vinyl group, an acrynoyl group, a methacrynoyl group, an epoxymethacrynoyl group, etc.; p and q are independently zero or an integer of 1 to 4; and n is an integer of 1 to 100, preferably 20 to 70, more preferably 25 to 50.

Examples of the resin of the formula (I) are a vinyl ether, isobutenyl ether, or allyl ether of poly(p-hydroxystyrene); an acrylate ester, methacrylate ester or epoxymethacrylate ester of poly(p-hydroxystyrene); brominated these resins mentioned above, etc.

These resins of the formula (I) can be produced by, for example, dissolving poly(p-hydroxystyrene) in a solvent such as acetone, etc., adding sodium hydroxide thereto to yield a sodium salt of poly(p-hydroxystyrene), adding gradually an acid chloride such as acrylic acid chloride, methacrylic acid chloride, to carry out a reaction, followed by separation and purification to yield the desired resin of the formula (I). When an alkyl group shown by the mark A is introduced into benzene rings, the solubility can be improved. When a halogen group shown by the mark X is introduced into benzene rings, the flame retardancy can be improved remarkably.

One or more resins of the formula (I) can be used in the thermosetting resin composition.

Another component used in the thermosetting resin composition is the epoxy modified polybutadiene represented by the formula:

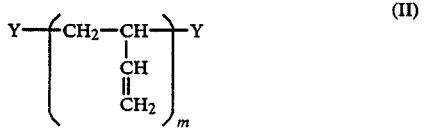

wherein Y is an epoxy resin; and m is an integer of 4 to 100.

Examples of the epoxy resin to be modified are diglycidyl ether bisphenol A, diglycidyl ether 2,2'-dibromobisphenol A, diglycidyl ether 2,2',4,4'-tetrabromobisphenol A, diglycidyl ether 2,2'-dimethylbisphenol A, diglycidyl ether 2,2',4-trimethylbisphenol A, phenol novolak type epoxy resin, ortho-cresol novolak type epoxy resin, alicyclic epoxy resin, etc. These epoxy resins can be used alone or as a mixture thereof.

By the addition of the epoxy modified polybutadiene of the formula (II) to the poly(p-hydroxystyrene) derivative resin of the formula (I), flexibility, adhesiveness to copper foils and mechanical properties can be improved.

Further, when a curing agent for epoxy resins is added to the thermosetting resin composition, the flexibility, adhesiveness to copper foils and mechanical properties can further be improved and at the same time, the dielectric constant can also be lowered.

The content of the epoxy modified polybutadiene of the formula (II) in the thermosetting resin composition is preferably in the range of 20 to 80% by weight. When the content is too much, the dielectric constant of the thermosetting resin composition becomes higher, while the flame retardancy, heat resistance and dimensional stability are lowered.

The prepreg and laminate of this invention can be produced as follows.

The poly(p-hydroxystyrene) derivative resin (I) is dissolved in an organic solvent to prepare a varnish. As the organic solvent, there can be used, for example, toluene, xylenes, acetone, methyl ethyl ketone, methyl isobutyl ketone, N,N-dimethylformamide, N-methylpyrrolidone, dimethylsulfoxide, trichloroethylene, trichloroethane, methylene chloride, dioxane, ethyl acetate, etc. Any solvents which can dissolve the thermosetting resin composition uniformly can be used. The epoxy modified polybutadiene (II) can be mixed dependent on purposes. To the thus prepared varnish, a radical polymerization initiator and a curing agent for epoxy resins are added to give a varnish for impregnation.

In this case, it is preferable to add a polyvalent carboxylic acid allyl ester which can react with the poly(p-hydroxystyrene) derivative resin (I) for improving mechanical properties in an amount of preferably 50% by weight or less, more preferably 20% by weight or less based on the total weight of the resin components. Examples of the polyvalent carboxylic acid allyl ester are triallyl trimellitate, diallyl terephthalate, diallyl isophthalate, diallyl orthophthalate, triallyl trimellitate, triallyl cyanurate, triallyl isocyanurate, trimetallyl isocyanurate, p,p'-diallyloxycarbonyl diphenyl ether, m,p'-diallyloxycarbonyl diphenyl ether, o,p'-diallyloxycarbonyl diphenyl ether, m,m'-diallyloxycarbonyl diphenyl ether, etc. These compounds can be used alone or as a mixture thereof.

Typical examples of the radical polymerization initiators are benzoyl peroxide, dicumyl peroxide, methyl ethyl ketone peroxide, t-butyl peroxylaurate, di-t-butyl peroxyphthalate, dibenzyl oxide, 2,5-dimethyl-2,5-di(t-butylperoxy)hexane, t-butyl cumyl peroxide, t-butyl hydroperoxide, di-t-butyl peroxide, 2,5-dimethyl-2,5-di(t-butylperoxy)hexine (3), diisopropylbenzene hydroperoxide, p-methane hydroperoxide, 2,5-dimethylhexane-2,5-dihydroperoxide, cumene hydroperoxide, etc. These radical polymerization initiators can be used in an amount of 0.1 to 10 parts by weight based on 100 parts by weight of the thermosetting resin composition.

Typical examples of the curing agent for epoxy resins are 4,4'-diaminodicyclohexylmethane, 1,4-diaminocyclohexane, 2,6-diaminopyridine, m-phenylenediamine, p-phenylenediamine, 4,4′-diaminodiphenylmethane, 2,2′-bis(4-aminophenyl)propane, benzine, 4,4′-diaminophenyl oxide, 4,4′-diaminophenylsulfone, bis(4-aminophenyl) methylphosphine oxide, bis(4-aminophenyl) phenylphosphine oxide, bis(4-aminophenyl)methylamine, 1,5-diaminonaphthalene, m-xylylenediamine, p-xylylenediamine, hexamethylenediamine, 6,6′-diamino-2,2′-dipyridyl, 4,4′-diaminobenzophenone, 4,4′-diaminoazobenzene, bis(4-aminophenyl)phenylmethane, 1,1′-bis(4-aminophenyl)cyclohexane, 1,1′-bis(4-amino-3-methylphenyl)cyclohexane, 2,5-bis(m-aminophenyl)-1,3-oxadiazole, 2,5-bis(p-aminophenyl)-1,3,4-oxadiazole, 2,5-bis(m-aminophenyl)thiazolo(4,5-d)thiazole, 5,5′-di(m-aminophenyl)-(2,2′)-bis(1,3,4-oxadiazolyl), 4,4′-diaminodiphenyl ether, 4,4′-bis(b-aminophenyl)-2,2′-dithiazole, m-bis(4-p-aminophenyl-2-thiazolyl)benzene, 4,4′-diaminobenzanilide, 4,4′-diaminophenyl benzoate, N,N′-bis(4-aminobenzyl)-p-phenylenediamine, 4,4′-methylenebis(2-dichloroaniline), dicyandiamide, benzoguanamine, methylguanamine, tetramethylbutanediamine, dibasic dihydrazide, phthalic anhydride, trimellitic anhydride, pyromellitic anhydride, benzophenonetetracarboxylic anhydride, ethylene glcol bis(anhydro trimellitate), glycelol tris-(anhydro trimellitate), maleic anhydride, 2-methylimidazole, 2-phenylimidazole, 2-ethyl-4-methylimidazole, 1-cyanoethyl-2-ethyl-4-methylimidazole, 2-undecylimidazole, 2-heptadecylimidazole, azine derivatives of these compounds, trimellitates of these compounds, nitrilethyl derivatives of these compounds, tetra-substituent phosphonium tetra-substituted borates of these compounds, etc. These compounds can be used alone or as a mixture thereof.

The curing agent for epoxy resins can be used in an amount of 0.1 to 30 parts by weight, more preferably 0.3 to 10 parts by weight, based on 100 parts by weight of the epoxy modified polybutadiene.

The resulting impregnation varnish is impregnated into a sheet-like base material and dried at from room temperature to 170° C. to give a prepreg having no stickiness. The drying temperature can be determined depending on the solvent used and the polymerization initiator used.

As the sheet-like base material, there can be used almost fibrous cloth conventionally used as laminate materials. As inorganic fibers, there can be used various glass fibers such as E glass, C glass, A glass, S glass, D glass, YM-31-A glass, each containing $SiO_2$, $A_2O_3$, etc., Q glass obtained by using coal, and the like. As organic fibers, there can be used aramide fibers containing aromatic polyamide-imide skeleton, etc.

The laminate can be obtained by piling a plurality of prepreg sheets and pressed preferably at 1 to 100 kgf/cm² with heating preferably at 100° to 250° C. to carry out curing reaction with heating.

The multilayer printed circuit board can be produced by laminating a plurality of insulating layers and a plurality of circuit conductor layers alternately, followed by pressing and heating preferably at 100° to 250° C. and 1 to 100 kgf/cm².

The circuit conductor layers can be prepared by forming a conductor layer on a prepreg such as that mentioned above, followed by circuit pattern formation according to a conventional method. As the conductor layer, there can be used a metal foil, plated layer or vapor deposited layer of copper, silver, gold, aluminum, chromium, molybdenum, tungsten, or the like. Among them, the use of a copper foil is preferable.

As the insulating layers, the laminates obtained from the special prepregs mentioned above are used. It is preferable that the insulating layer has a dielectric constant of 3.5 or less at 1 MHz. The resin of the formula (I) or resin composition including at least the resin of the formula (I) preferably has flame retardancy of V-O by the standard of UL 94, a glass transition temperature of 200° C. or higher and a thermal expansion coefficient of $10^{-4}$/°C. or less at room temperature. It is preferable that one insulating layer (laminate) has a plurality of prepreg sheets (the resin impregnated fibrous cloth layers) wherein the content of fibrous cloth in an insulating layer is preferably 20 to 40% by volume.

The thickness of the insulating layer is usually 250 μm or less. The number of fibrous cloth layers in one insulating layer is preferably 2 to 5. It is also preferable to laminate a thinner insulating layer (100 μm thick or less with two fibrous cloth layers) and a thicker insulating layer (150 μm thick or less with three fibrous cloth layers) alternately via circuit conductor layers. In this case, the line width on the circuit conductor layer is preferably 100 μm or less. An example of such a multilayer printed circuit board is shown in the attached drawing.

The resin of the formula (I) can also be used as a molding material by mixing with a radical polymerization initiator, a filler and the like conventional additives.

This invention is illustrated by way of the following Examples, in which all parts and percents are by weight unless otherwise specified.

EXAMPLES 1 to 4

Brominated poly(p-hydroxystyrene)(manufactured by Maruzen Petrochemicals Co., Ltd.) in an amount of 250 g was dissolved in 500 g of chloroform and 500 g of aqueous solution containing 120 g of sodium hydroxide was added thereto with stirring to carry out a reaction at 25° C. for 1 hour. Then, 200 g of a chloroform solution containing 120 g of methacrylic acid chloride was added thereto gradually and the reaction was continued at 25° C. for 2 hours. Subsequently, the chloroform solution and the aqueous solution were separated and the chloroform solution was condensed to give a reaction product. Then, the reaction product was dissolved in acetone, and purification was conducted while dropping the resulting solution into methanol.

In the same manner as mentioned above, acrylic acid chloride (Example 2), allyl chloride (Example 3), and epoxy methacrylic acid chloride (Example 4) were reacted in place of methacrylic acid chloride to yield reaction products, respectively.

EXAMPLES 5 AND 6 AND COMPARATIVE EXAMPLE 1

The process of Example 1 was repeated except for using poly(p-hydroxystyrene) and methacrylic acid chloride and acrylic acid chloride as the acid chloride, respectively.

As Comparative Example 1, brominated poly(p-hydroxystyrene) alone was used.

Properties of the reaction products of Examples 1 to 6 and the compound of Comparative Example 1 are listed in Table 1.

TABLE 1

| | Examples | | | | | | Comparative Example 1 |
|---|---|---|---|---|---|---|---|
| | 1 | 2 | 3 | 4 | 5 | 6 | |
| Molecular weight (Mw) | 7,400 | 7,900 | 6,700 | 14,500 | 35,000 | 17,400 | 4,000–10,000 |
| Bromine content (%) | 44 | 43 | 45 | 33 | — | — | 47–52 |
| Pyrolysis beginning temperature (°C.) | 300 | 340 | 310 | 300 | 320 | 330 | 300 |
| Dielectric constant | 2.9 | 3.1 | 2.7 | 3.5 | 2.9 | 3.2 | 4.1 |
| Acid value | 2.8 | 4.2 | 0.2 | 2.0 | 25.2 | 12.3 | 230 |

EXAMPLE 7

The brominated poly(p-hydroxystyrene) methacrylic acid ester obtained in Example 1 was dissolved in methyl ethyl ketone with heating to give a varnish with a solid content of 40 to 50%. Then, 3 parts of dicumyl peroxide as a radical polymerization initiator per 100 parts of the resin component was added to the vanish. Glass cloth of E glass (mfd. by Nitto Boseki Co., Ltd., 0.1 mm in thickness) was impregnated with the varnish and dried at 60° to 80° C. for 10 to 20 minutes to give tack-free prepreg sheets. Then, 10 prepreg sheets were laminated and pressed at 30 kgf/cm$^2$ with heating at 130° C. for 30 minutes, followed by pressing at 170° C. for 1 hour and at 220° C. for 2 hours to give a laminate.

EXAMPLE 8

The process of Example 7 was repeated except for using the brominated poly(p-hydroxystyrene) acrylic acid ester obtained in Example 2 to give a laminate.

EXAMPLE 9

The process of Example 7 was repeated except for using the brominated poly(p-hydroxystyrene) allyl ether obtained in Example 3 to give a laminate.

EXAMPLE 10

The process of Example 7 was repeated except for using the brominated poly(p-hydroxystyrene) epoxymethacrylic acid ester obtained in Example 4 and silica glass cloth (0.075 mm thick) as the sheet-like base material to give a laminate.

EXAMPLE 11

The process of Example 7 was repeated except for using a thermosetting resin composition comprising 70 parts of brominated poly(p-hydroxystyrene) methacrylic acid ester, 30 parts of polybutadiene modified with diglycidyl ether bisphenol A, and 0.6 part of 2-ethyl-4-methylimidazole as the curing agent for epoxy resins to give a laminate.

COMPARATIVE EXAMPLES 2 AND 3

As the laminate, there were used an epoxy resin laminate (GEA-67N, a trade name mfd. by Hitachi Chemical Co., Ltd.) and a polyimide resin laminate (GIA-67N, a trade name mfd. by Hitachi Chemical Co., Ltd.).

COMPARATIVE EXAMPLE 4

A varnish with 20 to 30% solid content was obtained by dissolving 50 parts of 1,2-polybutadiene prepolymer and 50 parts of phenol novolak type epoxy modified polybutadiene in xylene. As a radical polymerization initiator, 5 parts of dicumyl peroxide and 1 part of 2-ethyl-4-methylimidazole as a curing agent for epoxy resins were added to the varnish. Using the resulting varnish, a laminate was obtained in the same manner as described in Example 7.

Properties of the laminates obtained in Examples 7 to 11 and Comparative Examples 2 to 4 were tested and shown in Table 2.

TABLE 2

| | Examples | | | | | Comparative Example | | |
|---|---|---|---|---|---|---|---|---|
| | 7 | 8 | 9 | 10 | 11 | 2 | 3 | 4 |
| Resin plate | | | | | | | | |
| Curing time (min.) | | | | | | | | |
| 170° C. | 60 | 60 | 60 | 60 | 60 | 60–90 | 60 | 60 |
| 220° C. | 120 | 120 | 120 | 120 | 120 | — | 120 | 120 |
| Glass transition temp. (°C.) | 215 | 220 | 210 | 215 | 210 | 120 | 210 | 135 |
| Pyrolysis beginning temp. (°C.) | 340 | 350 | 330 | 320 | 310 | 260 | 325 | 320 |
| Laminate | | | | | | | | |
| Dielectric constant (1 MHz) | 3.3 | 3.2 | 3.0 | 3.4 | 3.5 | 4.7 | 4.7 | 3.6 |
| Linear expansion coefficient ($\times 10^{-5}$/°C.) | 5 | 6 | 6 | 4 | 8 | 20 | 6 | 15 |
| Solder heat resistance (300° C., 300 sec.) | No change | No change | No change | No change | No change | Blistered | No change | No change |
| Flexial strength (kgf/mm$^2$) | | | | | | | | |
| Room temp. | 45 | 43 | 46 | 50 | 40 | 45 | 45 | 28 |
| 180° C. | 35 | 30 | 34 | 35 | 30 | — | 30 | 20 |
| Flame retardancy | V-0 | V-0 | V-0 | V-0 | V-0 | V-0 | V-1 | HB |

TABLE 2-continued

| | Examples | | | | | Comparative Example | | |
|---|---|---|---|---|---|---|---|---|
| | 7 | 8 | 9 | 10 | 11 | 2 | 3 | 4 |
| UL-94 | | | | | | | | |

EXAMPLE 12

A varnish was obtained by dissolving the brominated poly(p-hydroxystyrene) methacrylic acid ester obtained in Example 1 in methyl ethyl ketone so as to make the solid content 40 to 50%. After adding 3 parts of dicumyl peroxide as a radical polymerization initiator to 100 parts of the resin component, the resulting varnish was impregnated into E glass cloth (50 μm thick) and dried at 60° to 80° C. for 10 to 20 minutes to give tack-free prepreg sheets. Then, two prepreg sheets were piled and surface-roughened copper foils were placed on both sides of the resulting prepreg so as to contact the roughened sides of the copper foils with the prepreg, followed by heating at 130° C. for 30 minutes, at 170° C. for 1 hour and at 220° C. for 2 hours, under a pressure of 30 kgf/cm², to give a copper-clad laminate with about 100 μm thick in the insulating layer portion. The copper-clad laminates were subjected to formation of circuit patterns of inner layers such as a signal layer, an electric source layer, a matching layer, etc. The copper surfaces of circuit patterns were treated in the following manner to form two-sides wiring unit circuit sheets.

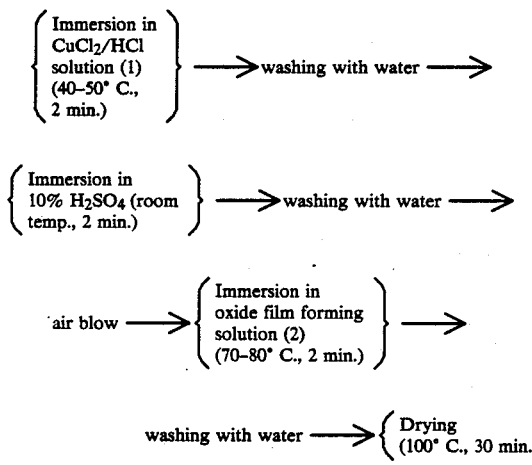

| Solution Compositions: | | |
|---|---|---|
| (1) | conc. HCl | 300 g |
| | Cupric chloride | 50 g |
| | Distilled water | 650 g |
| | (for roughening of copper surface) | |
| (2) | Sodium hydroxide | 5 g |
| | Trisodium phosphate | 10 g |
| | Sodium chlorite | 30 g |
| | Distilled water | 955 g |
| | (for stabilization of copper surface) | |

After the above-mentioned treatment, 30 layers of circuit conductor layers 2 were formed by using the above-mentioned unit circuit sheets with the structure as shown in the attached drawing, and bonding was conducted at 130° C. under pressure of 20 kg/cm² for 30 minutes, followed by heating at 170° C. for 1 hour and at 220° C. for 1 hours to give a multilayer printed circuit board. For multilayer bonding, 3 sheets of prepreg were piled for one insulating layer with a thickness of about 150 μm.

The multilayer bonding was carried out by inserting guide pins in holes formed on four sides of a sheet in order to prevent positional shift. After the multilayer bonding, through-holes 4 of 0.3 mm or 0.6 mm in diameter were formed by using a microdrill and a throughhole conductor was formed on whole surface of a throughhole by electroless copper plating. Then, outermost layer circuits were formed by etching to produce a multilayer printed circuit board.

The resulting multilayer printed circuit board has a size of 570mm×420mm with about 4 mm thick, with 2 kinds of line width of 70 μm and 100 μm, channel/grid=-2-3/1.3mm, and positional shift between layers about 100 μm. The glass cloth content in the insulating layer was about 30% by volume. In the attached drawing, numeral 1 denotes a copper-clad lamine (insulating layer), numeral 2 a circuit conductor layer, numeral 3 a prepreg resin sheet, and numeral 4 a through-hole.

According to this invention, since there is used the special resin of the formula (I) having a low dielectric constant, heat resistance, flame retardancy and a low thermal expansion coefficient, a compact multilayer printed circuit board can be produced and the signalling delay time can be reduced by about 15% compared with the prior art ones. Such reduction in the signalling delay time is very remarkable.

EXAMPLE 13

A molding material was prepared by mixing and kneading 100 parts of brominated poly(p-hydroxystyrene) allyl ether, 5 parts of dicumyl peroxide, 200 parts of molten qualtz glass powder as a filler, 100 parts of glass fiber with 3 mm long as a reinforcing agent, and 2 parts of a coupling agent in a kneader heated at about 80° C. for 10 minutes. Using this molding material, specimens of 127×13×1mm were produced by transfer molding under conditions of a mold temperature 180° C., a mold pressure 150 kg/cm² and a curing time 3 minutes.

The molded articles showed flame retardancy of V-O when tested according to the standards of UL 94. Further, storage stability of the molding material at 25° C. was as excellent as longer than 30 days, and flexial strength can be maintained with 90% of the initial value even if deteriorated at 200° C. for 30 days. The molded material was also excellent in heat resistance with heating weight loss of 3%.

In the above-mentioned Examples, various tests were carried out as follows:
(a) Glass transition temperature:
Thermal expansion coefficient of a resin cured article with 10 mm in a diameter and 2 mm in thickness was measured with a temperature rise rate of 2° C./min. and the temperature at which the thermal expansion coefficient changes is defined as the glass transition temperature.

(b) Pyrolysis beginning temperature:

A sample in an amount of 10 mg obtained by grinding a resin cured material was heated in air with a temperature rise rate of 5° C./min., and the temperature at which 5% of the weight loss was measured was defined as the pyrolysis beginning temperature.

(c) Dielectric constant:

Dielectric constant was obtained according to JIS C6481 by measuring an electrostatic capacity at a frequency of 1 MHz.

(d) Linear expansion coefficient:

Thermal expansion coefficient at the thickness direction of a laminate (10 mm square) was measured with a temperature rise rate of 2° C./min. and obtained from changed amounts from 50° C. to 200° C.

(e) Solder heat resistance:

JIS C6481

A sample was dipped in a solder bath heated at 300° C. for 300 seconds and changes of surface appearance was observed.

(f) Flexual strength:

JIS C6481

A laminate was cut into a piece of 25×50mm and placed on two supporting points with a distance of 30 mm and bended at a rate of 1 mm/min. at room temperature and at 180° C.

(g) Flame retardancy:

Flame retardancy was measured according to the standards of UL-94, perpendicular method.

The resin compositions of this invention are revealed that the reactions are almost completed from infrared spectra and the acid values listed in Table 1. Further, the obtained resins contain a large amount of bromine having a flame retardant effect and can be cured with heating at low temperatures. In addition, the obtained resins are preferably low dielectric constant materials with a dielectric constant of 3.5 or lower with a linear expansion coefficient of $10 \times 10^{-5}/°C$. or less, preferably $6 \times 10^{-5}/°C$. or less.

The laminate obtained by using at least the special resin of the formula (I) has the same properties in low dielectric constant as polybutadiene series materials known as low dielectric constant materials and can make the dielectric constant 4.7 to 3.5 or less compared with epoxy series materials and polyimide series materials widely applied to multilayer printed circuit boards used now for large-sized computers. Thus the signalling delay time can be reduced by about 15%.

Further properties of heat resistance and linear expansion coefficient expressed by the glass transition temperature, the pyrolysis beginning temperature and the solder heat resistance are excellent compared with the epoxy series materials and the polybutadiene series materials and equal to those of the polyimide series materials. In addition, as to the flame retardancy, the class of V-O in the UL standards can be obtained without adding any flame retardants.

As mentioned above, according to this invention, it is possible to produce laminate materials having a low dielectric constant as well as excellent heat resistance and flame retardancy.

What is claimed is:

1. A thermosetting poly(p-hydroxystyrene) derivative resin represented by the formula:

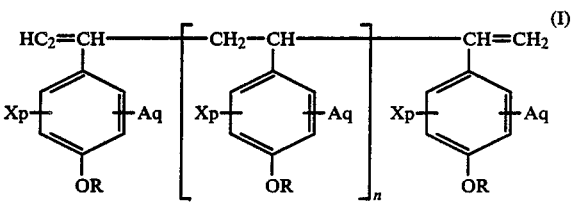

wherein A is an alkyl group; X is a halogen group; R is an alkenyl or alkenoyl group having 2 to 4 carbon atoms; p is an integer of 1 to 4; q is zero or an integer of 1 to 4; and n is an integer of 1 to 100.

2. A thermosetting resin according to claim 1, wherein R in the formula (I) is an ally group, an isobutenyl group, a vinyl group, an acrynoyl group, a methacrynoyl group, or an epoxymethacrynoyl group.

3. A thermosetting resin according to claim 2, wherein X in the formula (I) is bromine and p is an integer of 1 to 4.

4. A thermosetting resin according to claim 1, wherein A is an alkyl group containing 1 to 10 carbon atoms; X is a halogen group selected from the group consisting of fluorine, chlorine, bromine and iodine, and n is an integer of 20 to 70.

5. A thermosetting resin composition comprising a poly(p-hydroxystyrene) derivative resin represented by the formula:

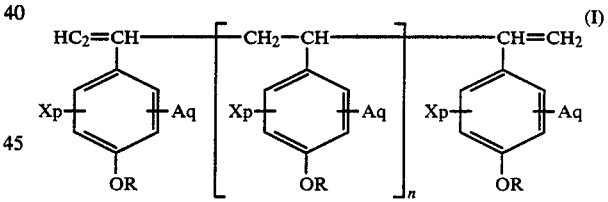

wherein A is an alkyl group; X is a halogen group; R is an alkylene or alkenoyl group having 2 to 4 carbon atoms; p is an integer of 1 to 4; q is zero or an integer of 1 to 4; and n is an integer of 1 to 100, and a radical polymerization initiator.

6. A thermosetting resin composition according to claim 5, wherein the radical polymerization initiator is present in an amount of 0.1 to 10 parts by weight based on 100 parts by weight of the resin composition.

* * * * *